United States Patent
Todd et al.

[11] Patent Number: 5,368,902
[45] Date of Patent: Nov. 29, 1994

[54] METHOD FOR MAKING PATTERNED THIN FILM

[75] Inventors: David W. Todd, Sebastopol; Lindsey Brown, Healdsburg; Roger W. Phillips, Santa Rosa; Elliot E. Overshiner, Kenwood, all of Calif.

[73] Assignee: Flex Products, Inc., Santa Rosa, Calif.

[21] Appl. No.: 57,427

[22] Filed: May 5, 1993

Related U.S. Application Data

[63] Continuation of Ser. No. 870,769, Apr. 20, 1992, abandoned, which is a continuation of Ser. No. 692,113, Apr. 26, 1991, abandoned, which is a continuation of Ser. No. 343,904, Apr. 26, 1989, Pat. No. 5,059,454.

[51] Int. Cl.$^5$ .............................................. B05D 5/12
[52] U.S. Cl. ............................... 427/601; 427/81; 427/99; 427/177; 427/178; 427/179; 427/249; 427/277; 427/264; 427/259; 427/293; 427/349
[58] Field of Search ............... 427/601, 99, 177, 178, 427/179, 81, 249, 264, 259, 277, 293, 349

[56] References Cited

U.S. PATENT DOCUMENTS

| | | | |
|---|---|---|---|
| 3,935,334 | 1/1976 | Narui et al. | 427/259 X |
| 4,040,891 | 8/1977 | Chang et al. | 156/344 X |
| 4,448,636 | 5/1984 | Baber | 156/344 X |
| 4,643,912 | 2/1987 | Nakagawa et al. | 427/526 |
| 4,663,192 | 5/1987 | Hatakeyama et al. | 427/108 |

FOREIGN PATENT DOCUMENTS 2068834 8/1981 United Kingdom .................. 427/57

OTHER PUBLICATIONS

Yamamori, "Margin Generating Mechanism . . . Coater", paper presented at Second International Conference on Vacuum Web Coating, Oct. 9–11, 1988, Fort Lauderdale, Fla., pp. 58–76.

*Primary Examiner*—Shrive Beck
*Assistant Examiner*—Benjamin L. Utech
*Attorney, Agent, or Firm*—Flehr, Hohbach, Test, Albritton & Herbert

[57] ABSTRACT

Method for providing a patterned thin film on a flexible web-like substrate having at least one surface. A patterned release coating which carries the desired pattern is deposited on the surface and has openings therein through which the surface of the substrate is exposed. A thin film is deposited over the patterned release coat and onto the portions of the surface exposed through the openings. The patterned release coating is then removed and the thin film portions carried thereby to provide a patterned thin film on the substrate.

10 Claims, 3 Drawing Sheets

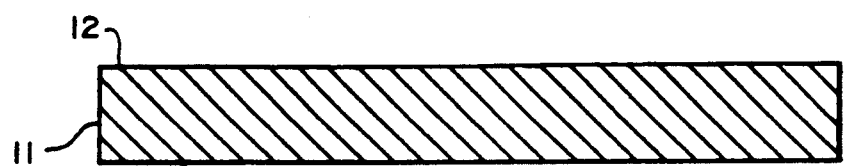
FIG.—1A
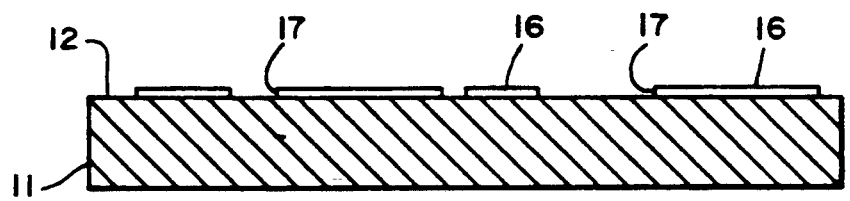
FIG.—1B
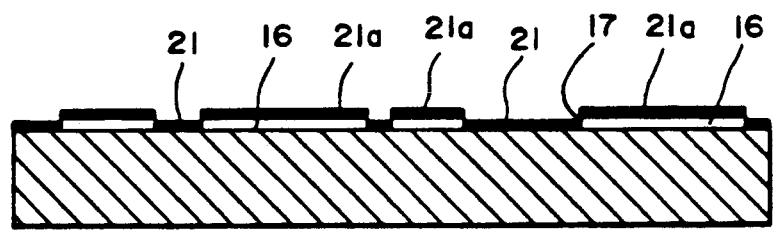
FIG.—1C
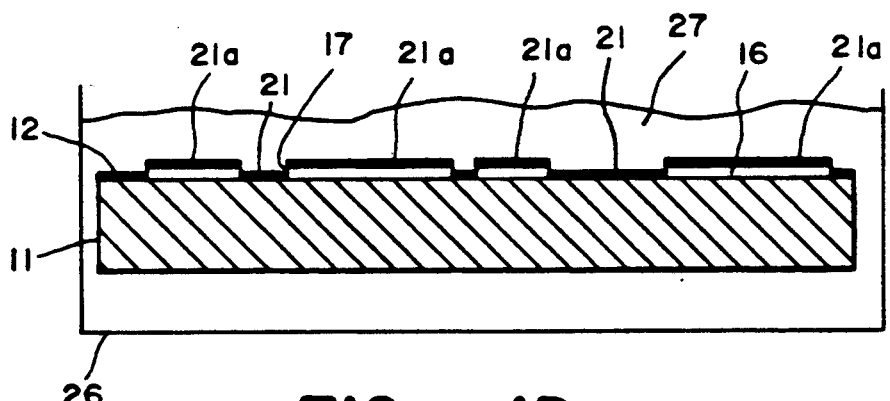
FIG.—1D
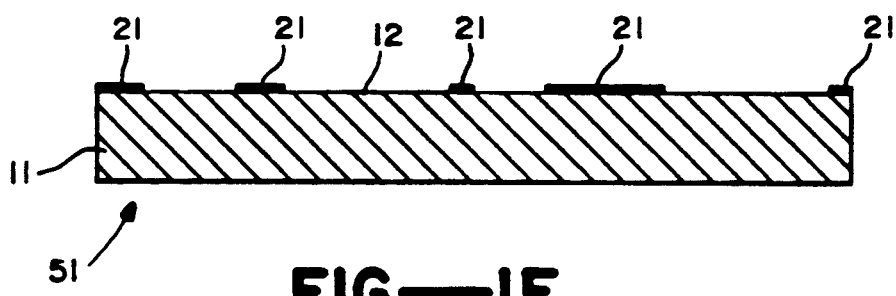
FIG.—1E

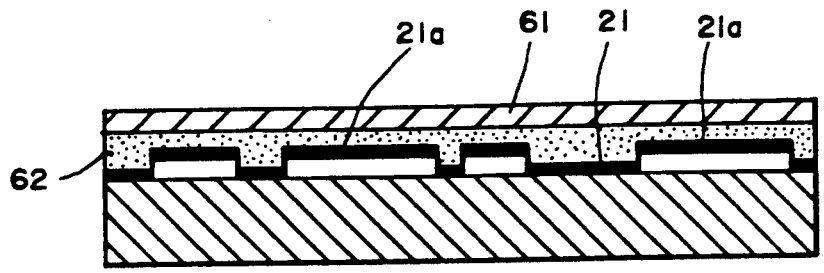
FIG.—2A
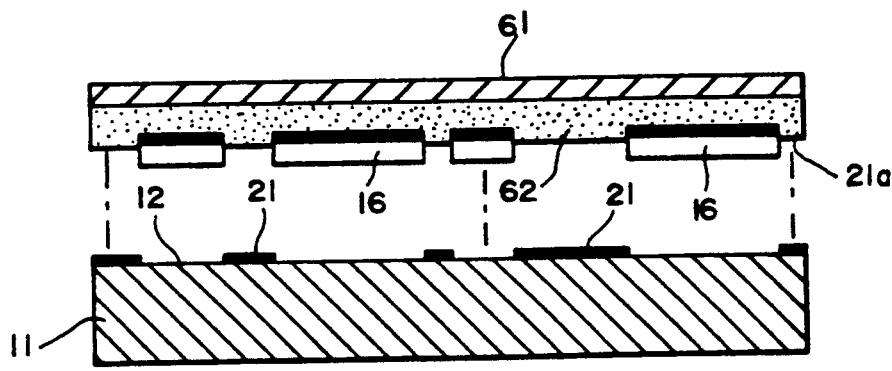
FIG.—2B
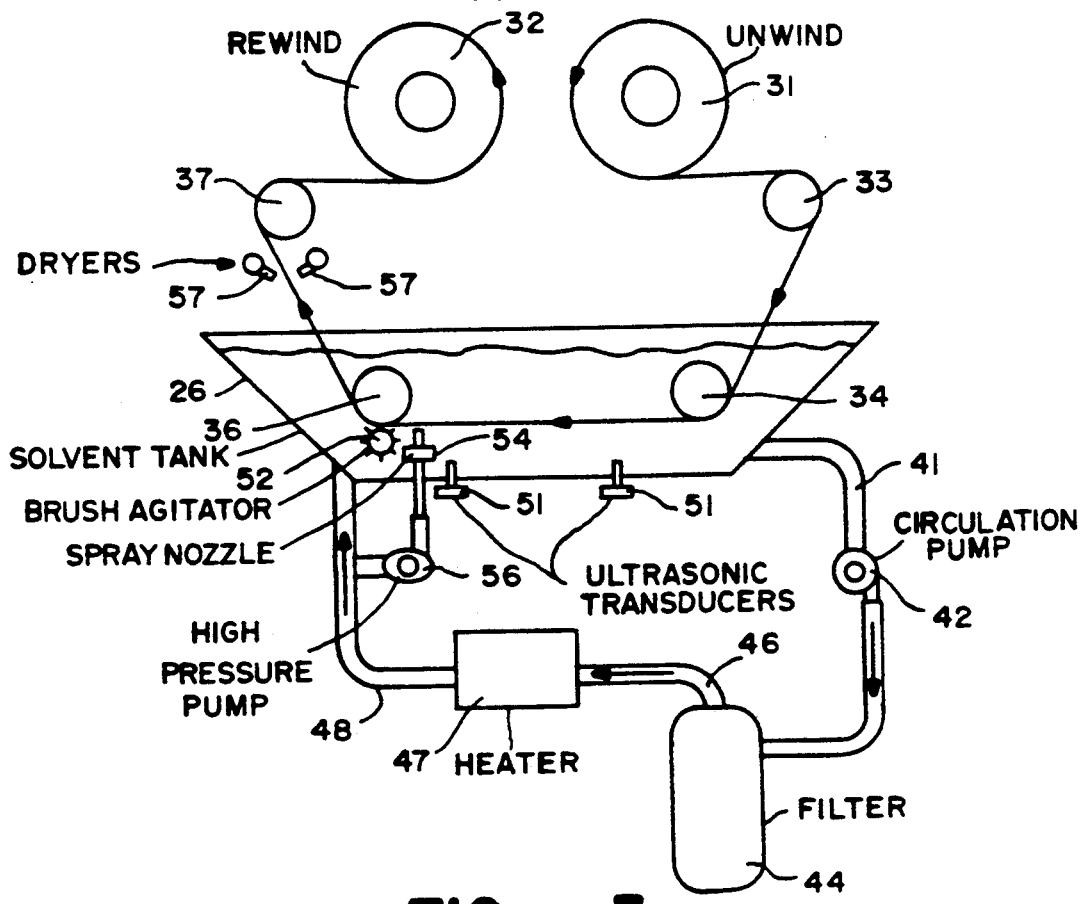
FIG.—3

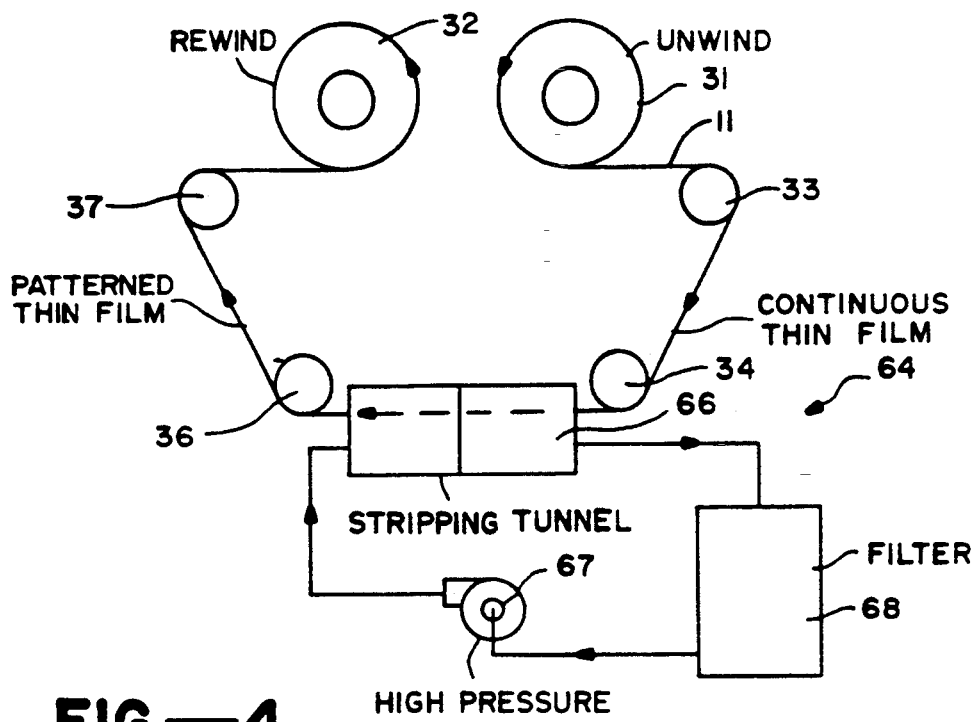
FIG.—4
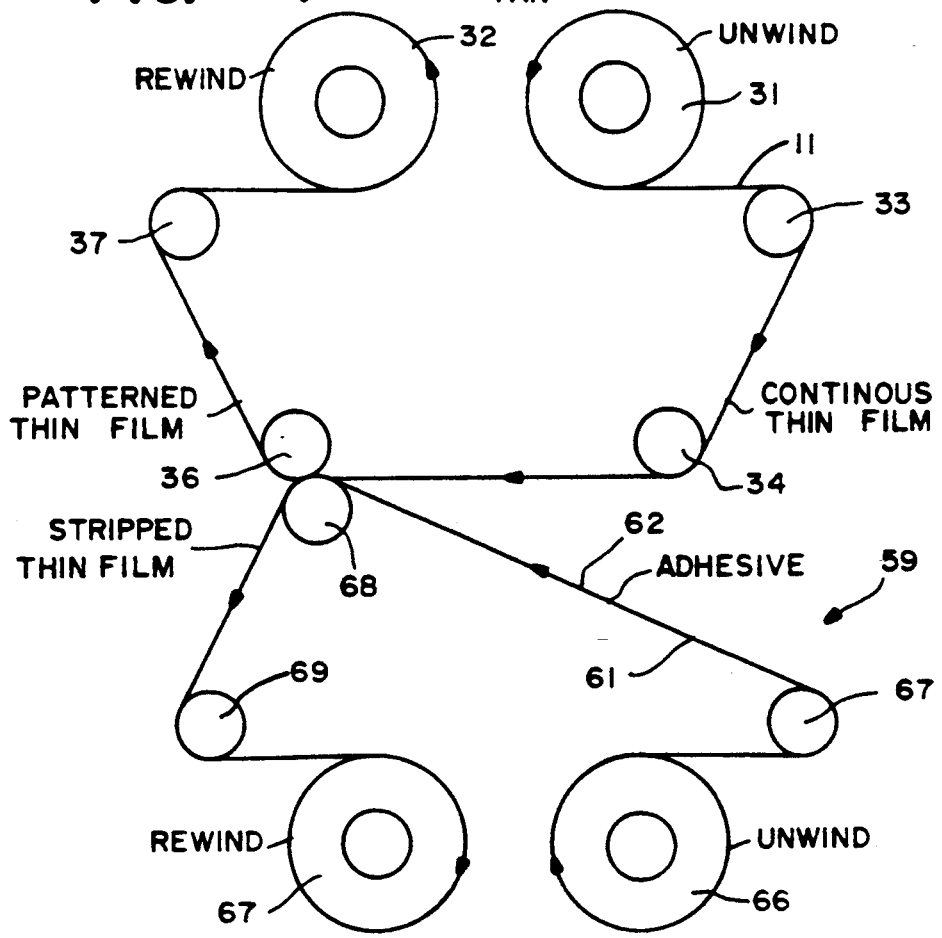
FIG.—5

METHOD FOR MAKING PATTERNED THIN FILM

This is a continuation of application Ser. No. 07/870,769 filed Apr. 20, 1992, now abandoned, which was a continuation of application Ser. No. 07/692,113 filed Apr. 26, 1991, now abandoned, which was a continuation of application Ser. No. 07/343,904 filed Apr. 26, 1989, now U.S. Pat. No. 5,059,454 issued Oct. 22, 1991.

This invention relates to a method for making a patterned thin film, and more particularly, to a method which is particularly applicable to flexible films which utilize patterned release layers.

In the past, patterned thin films have heretofore been provided, particularly in the semi-conductor industry in which patterning has been accomplished by the use of positive and negative photoresists. Typically, the material being patterned has been laid down as a layer and thereafter photoresists have been placed on the latter and exposed through a mask. The photoresist is thereafter developed to expose certain predetermined areas. An etchant is utilized to remove the undesired material in those predetermined areas in the layer. The photoresist is thereafter stripped to provide the pattern. In certain applications where it is desired to provide large areas of patterned thin films, such a method is uneconomic. There is therefore a need for a new and improved method for producing a patterned thin film and particularly one which can be carried on a flexible web-like or sheet-like substrate.

In general, it is an object of the present invention to provide a method for making a patterned thin film which is economic.

Another object of the invention is to provide a method of the above character which utilizes a patterned release coat laid down onto the flexible web.

Another object of the invention is to provide a method of the above character in which wet stripping can be utilized to remove the release coat.

Another object of the invention is to provide a method of the above character in which dry stripping can be utilized to remove the release coat.

Additional objects and features of the invention will appear from the following description in which the preferred embodiments are set forth in detail in conjunction with the accompanying drawings.

BRIEF DESCRIPTION OF THE DRAWINGS

FIGS. 1A, 1B, 1C, 1D, and 1E show the steps utilized for producing a patterned thin film utilizing wet stripping.

FIGS. 2A and 2B show the steps utilized for providing a patterned thin film utilizing dry stripping.

FIG. 3 is a schematic illustration of an apparatus utilized for accomplishing wet stripping.

FIG. 4 is a schematic illustration of an apparatus utilized for dry stripping.

FIG. 5 is a schematic illustration of the apparatus for an alternative method for dry stripping.

In general the method is for producing a patterned thin film on a flexible web-like substrate having at least one surface. The method comprises the steps of depositing a patterned release coat on the one surface with the release coat carrying the desired pattern. The release coat is provided with openings therein through which the surface of the substrate is exposed. A thin film is deposited over the patterned release coat and onto the portions of the surface exposed through the openings. The release coat is then removed with the portions of the thin film deposited thereon by either a wet stripping or dry stripping process so that there only remains on the substrate the thin film portions deposited on the surface of the substrate.

More particularly as shown in FIGS. 1A through 1E of the drawings, a patterned thin film process or a method for forming a patterned thin film utilizing wet stripping is shown. The web or substrate 11 shown in FIG. 1A is provided with upper and lower surfaces 12 and 13 and is formed of a flexible sheet or web of material often called a film having a suitable thickness as, for example, ½ mil to 5 mils formed of a suitable plastic such as a polyester, a polycarbonate, polyvinyl chloride or a polyamide. The web or substrate 11 can also be formed of a cellulose material such as paper or cloth and also can be formed of a woven fabric. This substrate 11 can be substantially transparent or can be provided with a color if desired. As hereinafter described the material 11 typically can be provided in roll form.

A patterned release coat or coating 16 is applied to the surface 12 of the substrate 11 by use of a standard printing technique such as rotogravure or a flexography. The release coating 16 is applied in a pattern so there are provided openings or holes 17 through which the surface 12 is exposed.

Depending upon the process utilized for stripping as hereinafter described, the material of which the release coating 16 is made is selected. Thus, if a water soluble release coat is desired, a suitable commercially available material such as a water soluble polyvinylpyrolidone is provided. Typically this material is deposited to a thickness ranging from 0.2 to 2 mils. Where it is desired to utilize a solvent other than water, the release coat 16 can be formed of other materials such a wax, acrylic polyamide, polyamide, urethane or epoxy which are dissolved in organic solvents such as methylethyl ketches, acetones, alcohol and the like. The release coat may be designed so that it has good mechanical adhesion to the substrate but poor mechanical adhesion to the thin film coating 21. Alternatively, it can be an insoluble coating with poor mechanical adhesion to the substrate, but good mechanical adhesion to the thin film coating 21.

After the release coat has been deposited as shown in FIG. 1B, a thin film coating 21 is deposited over the release coat 16 and into the openings 17. The thin film 21 can take various forms. For example, it can be a thin layer of metal, as for example, stainless steel, titanium or aluminum. Assuming that the metal is to have a functional purpose, the metal typically is deposited to a thickness where it is opaque. For stainless steel and other metals this typically is approximately 700 Angstroms. If a transparent thin film is desired, a layer of suitable material such as titanium oxide may be utilized having a thickness of approximately 500 Angstroms. Typically, the thin film coating can be deposited in a suitable manner, as for example, in a vacuum chamber in a roll coater in a manner well known to those skilled in the art. The release coat which was previously applied is applied outside the vacuum chamber. The thin film coating may have any number of optical, electrical or chemical barrier properties as desired by the end user of the patterned thin film. Thus, the thin film coating can be in the form of an interference film formed of multiple layers, for example, as metals and dielectrics in a manner well known to those skilled in the art.

After the thin film coating 21 has been applied, the web or substrate 11 carrying the thin film coating can be advanced into or placed in a stripping apparatus 24 as shown in FIG. 3 which is used for removing the undesired portion 21a of the thin film coating 21 and which may include mechanical means of the type hereinafter described to facilitate such removal. The stripping process utilized in the apparatus 24 is dependent upon the type of release coating applied. For example, if the release coating 16 is of a soluble type, then the substrate 11 is advanced into a trough or tank 26 containing a liquid solvent 27 which may be water when the release coating 16 is soluble in water. For other release coatings not soluble in water other solvents of the type hereinbefore described can be utilized. With a soluble release coating material the solvent enters the openings 17 in the release coating 16 and dissolves the release coating 16 underlying the undesired portions 21a of the thin film coating 21. Thus the portions 21a of the thin film coating 21 overlying the release coat can be removed from the substrate 11.

In the typical stripping apparatus 24 shown in FIG. 3 the web or substrate 11 is carried by unwind and rewind reels 31 and 32. The flexible substrate or web 11 passes from the rewind reel 31 over a roller 33 and then below a roller 34 which is immersed in the solvent 27 carried within the tank 26. The web 11 then passes from the roller 34 below the roller 36 and remains in the solvent 27 for a sufficient period of time so that the solvent can dissolve the release coating 16 to permit the portions 21a of the thin film carried by the release coating 16 to be separated from the web or substrate 11. Thereafter, the web passes over a roller 37 and is rewound onto the rewind reel 32.

Means is provided for recirculating the solvent 27 in the tank 26 and consists of piping 41 connected to the outlet from the tank 26 and connected to a circulation pump 42 which is connected by piping 43 to the inlet of the filter 44. The output of the filter 44 is connected by piping 46 to the inlet of a heater 47. The outlet of the heater 47 is connected by piping 48 to the inlet to the tank 26. Thus it can be seen that means is provided for filtering the solvent as it is recirculated. In addition, it can be seen that, if desired, the solvent can be heated to a desired temperature to facilitate the removal of the release coating.

If additional activity is required in order to cause the separation of portions 21a of the thin film carried by the release coating 16, agitation in the form of a mechanical agitation provided by suitable mechanical means such as ultrasonic transducers 51 located in the bottom of the tank 26 can be utilized for agitating the solvent 27. In addition, a mechanical brush agitator 52 can be provided adjacent the roller 36 to engage the exposed surface of the web or substrate 11 to ensure that the portions 21a of the thin film coating 21 carried by the patterned release coating 16 are separated from the web or substrate 11. Also Jets of solvent 27 can be provided when needed to and in the separation process. The jets can be provided by a spray nozzle 54 supplied with solvent from a high pressure pump 56 converted into the piping 48. Before the web or substrate 11 is wound onto the rewind reel 32, the web can be dried by suitable means such as a pair of dryers 57 disposed on opposite sides of the web 11 to dry the same prior to the web travelling over the roller 37.

After the undesired portions 21a of the thin film 21 carried by the release coat or coating 16 have been separated from the substrate 11, a completed product or article 61 is provided as shown in FIG. 1E in which there is provided a patterned thin film 21 disposed on the surface 12 and adherent thereto. The pattern provided by the thin film is determined by the pattern of the release coat 16. This pattern can take any desired configuration. Thin film patterns can be obtained with the relatively simple process of the present invention in which a patterned release coating determines the pattern of the thin film.

If the release coating utilized in the method shown in FIGS. 1 through 5 is of a type which is to be removed by mechanical means in the form of dry striping, apparatus 64 of the type shown in FIG. 4 can be utilized. As shown in FIG. 4, the web or substrate 11 is unwound from an unwind reel 31 onto a rewind reel 32 and passed over the rollers 33, 34, 36 and 37. However, rather than passing through a solvent tank 26, the web is advanced through a stripping tunnel 66. A high pressure fan 67 is provided for delivering air under pressure at one end of the stripping tunnel 66 opposite the direction of movement of the substrate or web 11. The air serves to remove the undesired portions 21a of the thin film 21 carried by the release coating 16 having poor mechanical adhesion to the web 11. The remaining portions of the thin film 21 have good adhesion to the substrate 11 are not removed. This separated material is filtered out in a filter 68. If desired, additional vibration can be imparted to the web 11 during the time it is traveling through the stripping tunnel to help ensure that the portions 21a of the thin film carried by the release coating are separated from the web or substrate 11.

In the event it is undesirable to utilize mechanical agitation to remove the thin film portions 21a from the web or substrate 11, a dry stripping apparatus 59 shown in FIG. 5 can be utilized to provide removal by mechanical means. The web or substrate 11 is again carried by the unwind and rewind reels 31 and 32 and passes over rollers 33, 34, 36 and 37. A web 61 is provided which has an adhesive 62 formed on one surface thereof. The web 61 can be carried by unwind and rewind reels 66 and 67 and can pass over rollers 67, 68 and 69 in passing from the unwind reel 66 to the rewind reel 67. The roller 68 is positioned in close proximity to the roller 36 so that the adhesive side of the web 61 comes into contact with the thin film portions 21a carried by the release coating 16. The thin film portion 21a becomes adherent to the adhesive 62 carried by the web 61 as shown in FIG. 2A. The adhesive utilized on the web 61 can be of any suitable type, for example, it can be a pressure sensitive adhesive, a thermally activated adhesive or a radiation sensitive-type adhesive activated by ultraviolet or electron beam radiation.

Continued travel of the web 61 and the substrate 11 causes separation or delamination of the release coating 16 and the substrate 11 and permits the patterned release coating 16 to be carried with the portions 21a of the thin film coating as shown in FIG. 2B so that there remains the substrate 11 with the patterned thin film 21 on the same. In this way it can be seen that all the portions of the thin film not adhered tightly to the surface 12 of the substrate 11 will be removed.

From the foregoing it can be seen that there has been provided a process or a method for providing a patterned thin film carried by a flexible substrate. The process by utilizing a patterned release coating makes it relatively easy to provide relatively large quantities of the patterned thin film by the use of roll coaters carrying flexible webs or substrates.

What is claimed is:

1. In a method for providing a patterned film on a flexible substrate in the form of a web having a surface by the use of a roll coater in a vacuum chamber having a roll over which the web travels with said surface being accessible in the vacuum chamber, forming directly on said surface of the web a patterned release coat to a thickness ranging from 127,000 to 508,000 Angstroms having openings therein through which said surface of the web is exposed, depositing in said vacuum chamber a film over the patterned release coat and onto the portions of the surface of the web exposed through the openings to a thickness of in excess of 700 Angstroms to provide opacity but insufficient to fill the openings and stripping the film portions carried by the release coat on the web so that there remain portions of the film formed on the web to provide a patterned film on the web.

2. A method as in claim 1 wherein the stripping is carried out by the use of a solvent.

3. A method as in claim 2 wherein the solvent is water.

4. A method as in claim 2 wherein the solvent is a solvent other than water.

5. A method as in claim 2 wherein the stripping of the film is accomplished by advancing the substrate through the solvent.

6. A method as in claim 5 together with the step of drying the substrate after it has been advanced through the solvent.

7. A method as in claim 1 wherein said film is formed by depositing multiple layers to form an interference film.

8. In a method for providing a patterned film on a flexible substrate in the form of a web having a surface by the use of a roll coater in a vacuum chamber having a roll over which the web travels with said surface being accessible in the vacuum chamber, forming directly on said surface of the web a release coat in a pattern to a thickness ranging from 0.5 to 2 mils having openings therein through which said surface of the web is exposed, depositing in said vacuum chamber a film over the patterned release coat and onto the portions of the surface of the web exposed through the openings to a thickness of in excess of 500 Angstroms but insufficient to fill the openings, stripping the film portions carried by the release coat on the web by use of a solvent so that there remain portions of the film formed on the web to provide a patterned film on the web and subjecting the solvent to vibration.

9. In a method for providing a patterned film on a flexible substrate in the form of a web having a surface by the use of a roll coater in a vacuum chamber having a roll over which the web travels with said surface being accessible in the vacuum chamber, forming directly on said surface of the web a patterned release coat to a thickness ranging from 0.5 to 2 mils having openings therein through which said surface of the web is exposed, depositing in said vacuum chamber a film over the patterned release coat and onto the portions of the surface of the web exposed through the openings to a thickness of in excess of 500 Angstroms but insufficient to fill the openings and removing the film portions carried by the release coat on the web so that there remain portions of the film formed on the web to provide a patterned film on the web and utilizing a release coat which has a greater adherence to the substrate than to the film.

10. In a method for providing a patterned film on a flexible substrate in the form of a web having a surface by the use of a roll coater in a vacuum chamber having a roll over which the web travels with said surface being accessible in the vacuum chamber, forming directly on said surface of the web a patterned release coat to a thickness ranging from 0.5 to 2 mils having openings therein through which said surface of the web is exposed, depositing in said vacuum chamber a film over the patterned release coat and onto the portions of the surface of the web exposed through the openings to a thickness of in excess of 500 Angstroms but insufficient to fill the openings and removing the film portions carried by the release coat on the web so that there remain portions of the film formed on the web to provide a patterned film on the web, said film being formed by depositing a metal to a thickness so that it is opaque.

* * * * *